United States Patent [19]

Erhardt

[11] Patent Number: 4,588,261
[45] Date of Patent: May 13, 1986

[54] IR-CCD IMAGER AND METHOD OF MAKING THE SAME

[75] Inventor: Harry G. Erhardt, Falls Township, Bucks County, Pa.

[73] Assignee: RCA Corporation, Princeton, N.J.

[21] Appl. No.: 618,453

[22] Filed: Jun. 7, 1984

[51] Int. Cl.⁴ .............................................. G02B 27/00
[52] U.S. Cl. ................................. 350/167; 250/578; 350/416; 350/417; 350/433
[58] Field of Search ............... 250/201 AF, 201 PF, 250/216, 578; 350/1.1, 167, 416, 417, 423, 433, 480

[56] References Cited

U.S. PATENT DOCUMENTS

| | | | |
|---|---|---|---|
| 3,734,599 | 5/1973 | Feldman | 350/433 |
| 3,742,600 | 7/1973 | Lowell | 29/592 |
| 3,778,126 | 12/1973 | Wilson | 316/20 |
| 3,778,127 | 12/1973 | Langston, Jr. et al. | 316/20 |
| 3,862,830 | 1/1975 | Stern | 65/58 |

OTHER PUBLICATIONS

"A High Photosensitivity IL-CCD Image Sensor with Monolithic Resin Lens Array", by Y. Ishihara et al., IEDM, 1983, pp. 497-500.
"Design and Performance of 64×128 Element PtSi Schottky-Barrier Infrared Charge-Coupled Device (IRCCD) Focal Plane Array", W. F. Kosonocky et al., SPIE vol. 344-Infrared Sensor Technology, 1982, pp. 66-76.

*Primary Examiner*—Eugene R. LaRoche
*Assistant Examiner*—James C. Lee
*Attorney, Agent, or Firm*—Birgit E. Morris; Donald S. Cohen

[57] ABSTRACT

An imager includes an imaging device and an lenticular array mounted on the imaging device. The imaging device includes a substrate of a semiconductor material having a pair of opposed major surfaces and an array of detectors at one of the major surfaces. The lenticular array includes a substrate having a pair of major surfaces and an array of lenses at one of the major surfaces. The lenticular array is mounted on the detector device with the other major surface of the lenticular array substrate being in closely spaced relation to the other major surface of the detector device substrate. Between the two opposed major surfaces of the two substrates is a bonding cement which extends only around the detector array. Dispersed within the bonding cement are hard spacer particles which are engaged by the opposed major surfaces of the two substrates to space the substrates apart.

13 Claims, 4 Drawing Figures

IR-CCD IMAGER AND METHOD OF MAKING THE SAME

The present invention relates to an infra-red charge coupled device (IR-CCD) imager and method of making the same. More particularly, the present invention relates to an IR-CCD imager having a lenticular array mounted on an imaging device and a method of making the same.

BACKGROUND OF THE INVENTION

There has been developed an IR-CCD imaging device which includes an array of IR detectors coupled to a CCD register which stores and transfers the signals from the detectors. Such a device is described in the article of W. F. Kosonocky et al., entitled "DESIGN AND PERFORMANCE OF 64×128 ELEMENT PtSi; SCHOTTKY-BARRIER INFRARED CHARGE-COUPLED DEVICE (IRCCD) FOCAL PLANE ARRAY" published in SPIE, Volume 344, Infrared Sensor Technology (1982) pp. 66–77. Although there have been improvements in such IR-CCD imaging devices in terms of numbers of elements of resolution and overall device size, a continual problem has been to achieve high fill-factors in order to provide the sensitivities required for certain applications of the imaging device. The term "fill-factor" refers to the ratio of active photo-sensing detector areas to the total area of the imaging cell. Areas of the device which are not used to sense signal, such as the CCD registers used to carry the charge, represent dead areas posing limitations on resolution and other system parameters.

One method to overcome these problems is to use a lenticular array structure to focus all the incoming signal onto the photo-sensing detectors. To properly mount a lenticular array on an imaging device raises a number of problems. One problem is to achieve proper alignment between the lenticular array and the detector areas of the imaging device. Another problem is to achieve uniform and accurate spacing between the lenticular array and the imaging device. Still another problem is to achieve a bond between the lenticular array and the imaging device which is strong enough to withstand the cryogenic (77 K.) temperature required to operate the infra-red arrays. Any bonding and spacing means must be around the edge of the lenticular array and imaging device in order that there is no obstruction to the passage of the imaging signal through the lenticular array into the imaging device. Although shims can be placed between the imaging device and the lenticular array to achieve the desired spacing, because of the limited area available to achieve both spacing and bonding, the shims must be of minimum size to allow sufficient area for the bonding needs.

SUMMARY OF THE INVENTION

An imager includes a substrate of semiconductor material having a pair of opposed major surfaces and a array of detectors at one of said major surfaces, and a lenticular array including a substrate having a pair of opposed major surfaces and an array of lenses found along one of said major surfaces. The lenticular array substrate has its other major surface in closely spaced relation to the other surface of the semiconductor substrate. A bonding material is between the other surfaces of the substrates only round the edge of the lenticular array substrate with said bonding material securing the substrates together. Solid spacer means are within the bonding means and engage the other surfaces of the substrates to space them apart.

DETAILED DESCRIPTION OF PREFERRED EMBODIMENT

Figure 1:
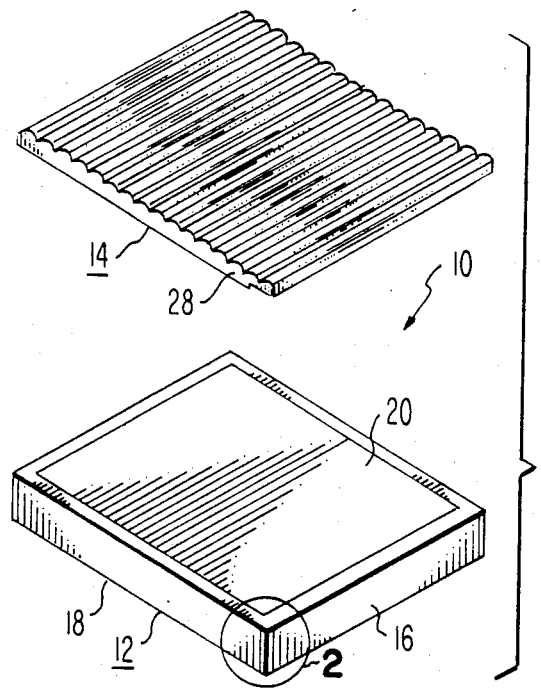
FIG. 1 is an exploded perspective view of a form of the imager of the present invention.
Figure 2:
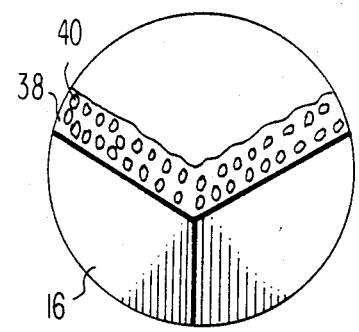
FIG. 2 is an enlarged perspective view of the portion of the imaging device encircled in FIG. 1.

Referring to FIG. 1, an IR-CCD imager which incorporates the present invention is generally designated as 10. The imager 10 includes an imaging device 12 and a lenticular array 14.

Figure 3:
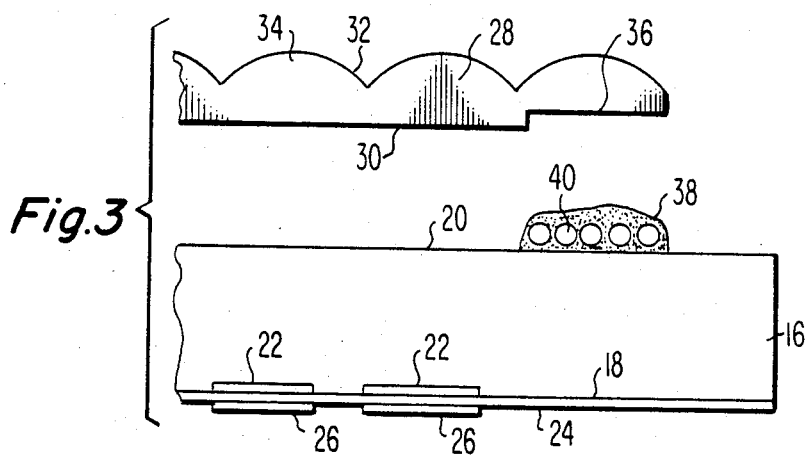
FIG. 3 is a sectional view of a portion of the imager illustrating the manner of assembling it.
Figure 4:
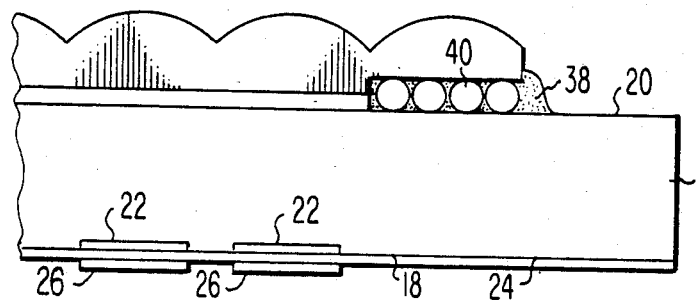
FIG. 4 is a sectional view similar to FIG. 3 showing the assembled imager.

The imaging device 12 includes a substrate 16 of single crystal semiconductor material, such as silicon, having a pair of opposed major surfaces 18 and 20. The substrate 16 includes along the surface 18 an array of detectors and a CCD storage and transfer device of the type described in the previously referred to article of W. F. Kosonocky. As shown in FIGS. 3 and 4, the detector array includes areas 22 of a metal silicide formed in the substrate 16 along the surface 18. Each of the metal silicide areas 22 forms a Schottky-barrier junction with the substrate 16. A layer 24 of silicon oxide covers the substrate surface 18 including the detector areas 22. Areas 26 of a metal, such as aluminum, are on the silicon oxide layer 24 with each metal area 26 being directly over a detector area 22. The metal areas 26 act as reflectors for radiation passing through the substrate 16 to reflect the radiation back into the detector areas 22.

The lenticular array 14 is a substrate 28 of a material which is transparent to the radiation being detected. For an infra-red detector a substrate 28 of single crystalline silicon has been found to be satisfactory. The substrate 28 has a pair of opposed major surfaces 30 and 32. An array of individual lenses 34 is formed in the substrate surface 32. The lenses 34 may be formed in the manner described in the copending patent application of J. Kane, Ser. No. 489,222, filed Apr. 27, 1983, entitled "Method of Fabricating A Silicon Lens Array", assigned to the same assignee as the present application. The lenses 34 are of a size and are arranged to correspond to the size and arrangement of the detector areas 22 in the substrate 16. The substrate 28 has a groove 36 in the surface 30 with the groove 36 extending around the edge of the substrate 28.

The lenticular array 14 is mounted on the imaging device 12 with the surface 30 of the lenticular array substrate 28 being in closely spaced relation with the surface 20 of the imaging device substrate 16, and with each of the lenses 34 being aligned with a detector 22. The lenticular array substrate 28 is securred to the imaging device 16 by a bonding material 38 which is between the surfaces 20 and 30 only around the edge of the lenticular array substrate 28 and outside the array of detectors 22. The bonding material 38 is retained within the recess 36 in the lenticular array substrate 28. The bonding material 38 is one which will strongly bond the substrates 16 and 28 together and which will withstand the cryogenic temperature at which the imager 10 operates. I have found that epoxy resin cements are suitable for this purpose. Dispersed within the bonding material 38 are spacers 40. The spacers 40 are particles of a hard material which is compatible with the bonding material, such as polystyrene or silica (glass) spheres. The spacer particles 40 should be of a size no greater than the desired spacing between the substrate 16 and 28 plus the depth of the groove 36.

To mount the lenticular array 14 on the imaging device 16, the bonding material 38 having the spacer particles 40 dispersed therein is applied to the surface 20 of the imaging device substrate 16 around the array of detectors 22. The lenticular array substrate 28 is then placed on the imaging device substrate 16 with the bonding material 38 being within the groove 36. Alternatively, the bonding material 38 with the spacer particles 40 dispersed therein can be placed in the groove 36 in the lenticular array substrate 28 and the imaging device substrate 16 can be placed on the lenticular array substrate 28. In either method, the substrates 16 and 28 are then pressed together until the movement is stopped by the spacer particles 40 contacting the opposed surfaces of the substrates. This provides the desired spacing between the opposed surfaces 20 and 30 of the substrate 16 and 28. The position of the lenticular array substrate 28 with regard to the imaging device substrate 16 is then adjusted to bring each of the lenses 34 over a separate one of the detectors 22. This can be accomplished by the method described in my copending patent application entitled "Alignment Method", Ser. No. 618,452, filed on the same date as the present application. The bonding material 38 is then hardened to secure the lenticular array 14 to the imaging device 12.

Thus there is provided by the present invention an imager 10 having a lenticular array 14 bonded securely to the imaging device 12 with accurate spacing between the lenticular array and the imaging device. By having the spacing particles 40 within the bonding material 38 the accurate spacing between the lenticular array 14 and the imaging device 12 is easily achieved and the spacing means does not take up a lot of space which is used by the bonding material so that a good bond is achieved between the lenticular array and the imaging device. Although the lenticular array 14 is shown as having therein the bonding material retaining groove 36, the groove can be formed in the surface 20 of the imaging device 12 or portions of the groove can be formed in both the lenticular array and the imaging device.

I claim:

1. An imager comprising
a substrate of semiconductor material having a pair of opposed major surfaces and an array of detectors at one of said major surfaces,
a lenticular array including a substrate having a pair of opposed major surfaces and an array of lenses formed along one of said major surfaces, said lenticular array substrate having its other major surface in closely spaced relation to the other surface of the semiconductor substrate,
a bonding material between the other surfaces of said substrates only around the edge of the lenticular array substrate, said bonding material securing said substrates together, and
solid spacer means within said bonding means and engaging the other surfaces of said substrates to space them apart.

2. An imager in accordance with claim 1 in which said bonding material is a cement.

3. An imager in accordance with claim 2 in which said spacer means is particles of a hard material disposed within said bonding cement.

4. An imager in accordance with claim 3 in which said bonding material is an epoxy cement.

5. An imager in accordance with claim 3 in which the lenticular array substrate has a groove in its other surface around the periphery of the substrate and the bonding material is within the groove.

6. An imager in accordance with claim 5 in which the largest size of the spacer particles is equal to the desired spacing between the substrates plus the depth of the groove in the lenticular array substrate.

7. A method of making an imager which includes an imaging device substrate having a pair of opposed major surfaces and an array of detectors at one of said surfaces and a lenticular array substrate having a pair of opposed major surfaces and an array of lenses along one of said major surfaces, said method including the steps of
placing a bonding material having spacer means therein around the other major surface of one of said substrates,
placing the other major surface of the other substrate over the other major surface of the one substrate,
pressing the two substrates together until their movement is stopped by the spacer means, and then hardening the bonding means.

8. A method in accordance with claim 7 in which the bonding material is a cement and the spacer means is hard particles dispersed in the cement.

9. A method in accordance with claim 8 in which the bonding cement containing the spacer particles is placed over the other surface of the imager device substrate around the detector array.

10. A method in accordance with claim 9 in which the lenticular array substrate has a groove in its other surface around the periphery of the substrate and the lenticular array substrate is placed over the imaging device substrate with the bonding cement being within the groove.

11. A method in accordance with claim 8 in which the bonding cement containing the spacer particles is placed on the other surface of the lenticular array substrate around the periphery of the substrate.

12. A method in accordance with claim 11 in which the lenticular array substrate has a groove in its other surface around the periphery of the substrate and the bonding cement is placed in the groove.

13. A method in accordance with claim 8 including the step of positioning the lenticular array substrate with respect to the imaging device substrate so that each lense is over a detector prior to hardening the bonding cement.

* * * * *